United States Patent
Kaajakari

(10) Patent No.: US 8,334,736 B2
(45) Date of Patent: *Dec. 18, 2012

(54) MICROMECHANICAL RESONATOR

(75) Inventor: Ville Kaajakari, Pasadena, CA (US)

(73) Assignee: Murata Electronics Oy, Vantaa (FI)

( * ) Notice: Subject to any disclaimer, the term of this patent is extended or adjusted under 35 U.S.C. 154(b) by 0 days.

This patent is subject to a terminal disclaimer.

(21) Appl. No.: 13/284,196

(22) Filed: Oct. 28, 2011

(65) Prior Publication Data

US 2012/0091854 A1    Apr. 19, 2012

Related U.S. Application Data

(63) Continuation of application No. 12/320,347, filed on Jan. 23, 2009, now Pat. No. 8,102,224.

(60) Provisional application No. 61/023,414, filed on Jan. 24, 2008.

(51) Int. Cl.
*H03H 9/00* (2006.01)
*H03H 9/05* (2006.01)
*H03H 9/125* (2006.01)
*H03H 9/24* (2006.01)

(52) U.S. Cl. ......... 333/186; 333/197; 333/200; 310/309

(58) Field of Classification Search ................. 333/186, 333/197, 200; 310/309; 257/415
See application file for complete search history.

(56) References Cited

U.S. PATENT DOCUMENTS

| | | | |
|---|---|---|---|
| 5,914,553 A | | 6/1999 | Adams et al. |
| 6,000,280 A | * | 12/1999 | Miller et al. ............ 73/105 |
| 6,744,174 B2 | | 6/2004 | Paden et al. |
| 6,831,531 B1 | * | 12/2004 | Giousouf et al. ............ 333/200 |
| 6,856,217 B1 | * | 2/2005 | Clark et al. ............ 333/186 |
| 7,213,458 B2 | * | 5/2007 | Weber et al. ............ 73/504.12 |
| 7,258,010 B2 | | 8/2007 | Horning et al. |
| 7,859,365 B2 | | 12/2010 | Ho et al. |
| 8,102,224 B2 | * | 1/2012 | Kaajakari ............ 333/186 |
| 2002/0190607 A1 | | 12/2002 | Paden et al. |
| 2005/0073078 A1 | | 4/2005 | Lutz et al. |
| 2006/0125576 A1 | | 6/2006 | Ho et al. |
| 2007/0182291 A1 | | 8/2007 | Isobe et al. |
| 2008/0186109 A1 | | 8/2008 | Ho et al. |

OTHER PUBLICATIONS

Rong Liu et al., "Mems Resonators That are Robust to Process-Induced Feature Width Variations", IEEE International Frequency Control Symposium and PDA Exhibition, 2001, pp. 556-563.
International Search Report PCT/FI2009/000020 filed Jan. 23, 2009.

* cited by examiner

*Primary Examiner* — Barbara Summons
(74) *Attorney, Agent, or Firm* — Squire Sanders (US) LLP

(57) ABSTRACT

The invention relates to design of micromechanical resonators and, more precisely, to the design of microelectromechanical systems (MEMS) resonators. The invention provides an improved design structure for a microelectromechanical systems (MEMS) resonator including a movable mass structure and a spring structure. The spring structure includes a spring element. The spring element is anchored from one end and connected to a plurality of electrode fingers on another end. The plurality of electrode fingers are operatively connected together at the other end of the spring element. The improved structure is frequency robust to manufacturing variations and enables reliable frequency referencing with good performance, particularly in small size solutions.

15 Claims, 8 Drawing Sheets

MICROMECHANICAL RESONATOR

CROSS-REFERENCE TO RELATED APPLICATIONS

The present application is a continuation of U.S. patent application Ser. No. 12/320,347, filed Jan. 23, 2009, now U.S. Pat. No. 8,102,224, the contents of which are hereby incorporated by reference, which claims priority of U.S. Provisional Patent Application No. 61/023,414, filed on Jan. 24, 2008, the contents of which are hereby incorporated by reference.

FIELD OF THE INVENTION

The invention relates to design of micromechanical resonators and, more precisely, to the design of microelectromechanical systems (MEMS) resonators. The object of the invention is to provide an improved design structure for a microelectromechanical systems (MEMS) resonator that is frequency robust to manufacturing variations and enabling reliable frequency referencing with good performance, particularly in small size solutions.

BACKGROUND OF THE INVENTION

Resonators form a key component of a timing or frequency reference. The resonators are actuated to oscillate near the natural resonant frequency. This natural resonant frequency depends on the material and shape of the resonators.

For reference applications, it is desired that the resonant frequency is precisely controlled. For typical applications, the required frequency accuracy ranges from 1 to 100 part per million (ppm). This ppm level accuracy requires extremely good manufacturing tolerances. In addition, final calibration in the form of mechanical and/or electrical adjustment is often performed.

Micromechanical resonators have been widely used as a key component in MEMS devices, such as micro-gyroscopes, microvibromotors, micro-engines and microwave systems. The resonators are actuated, e.g. electrostatically, to oscillate near the natural resonant frequency.

Furthermore, micromechanical resonators are may also be used to complement quartz technology in frequency references. However, the frequency accuracy of micromechanical resonators needs to be improved before they can challenging the quartz technology.

Micromechanical resonators that are made by a combination of optical lithography and etching processes offer size and cost advantages over conventional quartz crystal resonators. However, the manufacturing variations in a micromechanical process can be several percentages of the devices dimensions.

For a better understanding of the prior art relation to the present invention reference will be made to the accompanying drawings, in which:

FIG. 1 illustrates a basic mechanical resonator according to prior art.

FIG. 2 illustrates a lumped model for the basic mechanical resonator according to prior art.

FIG. 1 illustrates a basic mechanical resonator according to prior art. A simple resonator consists of a spring element 1 and a rectangular mass 2. The spring element 1 can for example be a mechanical cantilever spring 1 as shown in FIG. 1.

In a simple resonator of FIG. 1, the resonant frequency $\omega_0$ is given by $$\omega_0 = \sqrt{\frac{k}{m}}, \quad (1)$$

where the spring constant k is given by $$k = Y\frac{w^3 h}{4L^3}. \quad (2)$$

FIG. 2 illustrates a lumped model for the basic mechanical resonator according to prior art. Here Y is the Young's modulus for the material, w is the width of the spring element, h is the height of the spring element, and L is the spring element length. The spring element width w is typically small and due to cubic dependency, the resonant frequency $\omega_0$ is very sensitive to the variations in spring element width w.

The first-order change of the resonant frequency $\omega_0$ with respect to spring element width w is $$\frac{\Delta\omega_0}{\omega_0} = \frac{3}{2}\frac{\Delta w}{w}, \quad (3)$$

where $\partial\omega_0$ is the infinitesimal frequency change due to the infinitesimal spring element width change $\partial w$. One of the most significant problems in the design of micromechanical resonators is the variation of the resonant frequency, which is caused by poor dimensional precision in the structures. In resonators manufactured using the means of micromechanics, there may be quite substantial dimensional tolerance errors.

For example, following from the above equation (Equation 3), if the spring element width varies by 4%, the resonant frequency varies by 6% or 60,000 ppm. To reduce this variation, it is desired that the resonant frequency is relatively unaffected by the manufacturing variations.

Thus, the object of the invention is to provide a structure of a micromechanical resonator which has an improved frequency accuracy in comparison to the prior art solutions. The present invention meets this need.

SUMMARY OF THE INVENTION

In accordance with an embodiment of the present invention, there is provided an improved design structure for a microelectromechanical systems (MEMS) resonator, which is frequency robust to manufacturing variations and which enables reliable frequency referencing with good performance, particularly in small size solutions.

According to an aspect of the invention, there is provided a micromechanical resonator including a movable mass structure and a spring structure including a spring element. The spring element is anchored from one end and connected to a plurality of electrode fingers on another end. The plurality of electrode fingers are operatively connected together at the other end of the spring element.

An embodiment of the invention includes the spring structure including two spring elements that are anchored together to form a tuning fork structure.

In an embodiment of the present application, a width of the spring element is greater than the widths of the electrode fingers, the widths of the electrode fingers are dimensioned so that a sensitivity of a resonant frequency change with respect to dimensional manufacturing variations $d(\Delta\omega_0/\omega_0)/d\delta$ approaches zero. $\Delta\omega_0/\omega_0$ is a frequency change of a resonant frequency $\omega_0$ and $\delta$ is a dimension change.

In addition, in accordance with an embodiment of the present application, a width of the spring element is two to five times the widths of the electrode fingers.

Furthermore, in accordance with an embodiment of the present application, a width of the spring element is approximately three times the widths of the electrode fingers.

In an embodiment of the present application, resonant frequencies of the electrode fingers are two to five times higher than a resonant frequency of the micromechanical resonator.

In accordance with a further embodiment of the present application, widths of the electrode fingers are dimensioned so that a slope of a resonant frequency change with respect to dimensional manufacturing variation change approaches zero at two or more locations.

In accordance with an embodiment of the present application, widths of the electrode fingers are configured so that a resonance frequency $$\omega_f = 0.8\sqrt{\frac{Y}{\rho}}\frac{w_f}{L_f^2}$$

of each of the electrode fingers is taken into account. $w_f$ is an electrode finger width, is an electrode finger length, $\rho$ is a density, and Y is Young's modulus.

In an embodiment of the present application, in dimensioning widths of the electrode fingers, an effect of bending of the electrode fingers is taken into account.

In a further embodiment of the present application, lengths of the electrode fingers is dimensioned so that electrode finger resonant frequency affects a resonant frequency of the micromechanical resonator to generate a localized maximum of a micromechanical resonator resonant frequency change with respect to dimensional manufacturing variation change.

In addition, in accordance with an embodiment of the present application, lengths of the electrode fingers are ⅙ to ½ times a length of the spring element.

Furthermore, in accordance with an embodiment of the present application, the micromechanical resonator also includes means for actuating the resonator electrostatically.

In an embodiment of the present application, the micromechanical resonator has a width of an electrode gap from 500 nm to 5 μm.

In accordance with an embodiment of the present application, the finger electrodes in the tuning fork structure are symmetrically arranged to those in another fork structure.

Also, in accordance with an embodiment of the present application, the micromechanical resonator includes a plurality of inter-digital electrodes for each of the pluralities of the finger electrodes.

BRIEF DESCRIPTION OF THE DRAWINGS

For a better understanding of the present invention and in order to show how the same may be carried into effect reference will now be made to the accompanying drawings, in which.

DETAILED DESCRIPTION OF CERTAIN EMBODIMENTS

The solution according to the present invention presents a new structure of a micromechanical resonator which has an improved frequency accuracy in comparison to the prior art solutions.

Figure 3:
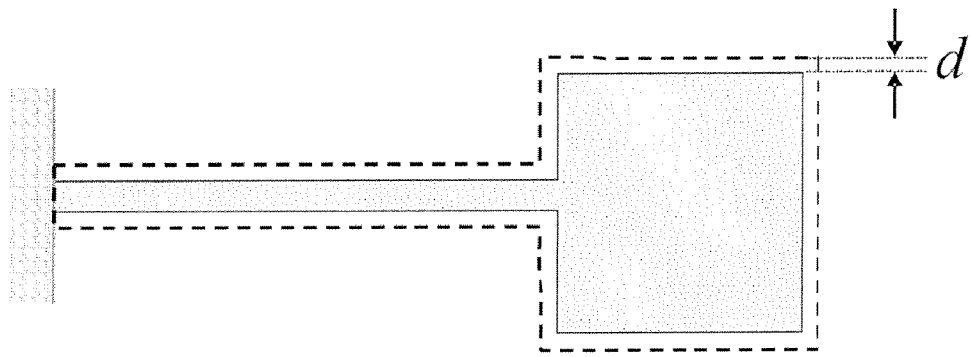
FIG. 3 illustrates the dimension changes of a basic mechanical resonator due to lithography or etch variations according to the present invention.

FIG. 3 illustrates the dimension changes of a basic mechanical resonator due to lithography or etch variations according to the present invention. The key in reducing the effect of manufacturing variations is to note that in a typical micromanufacturing process, many dimensions change by an almost equal amount.

Figure 1:
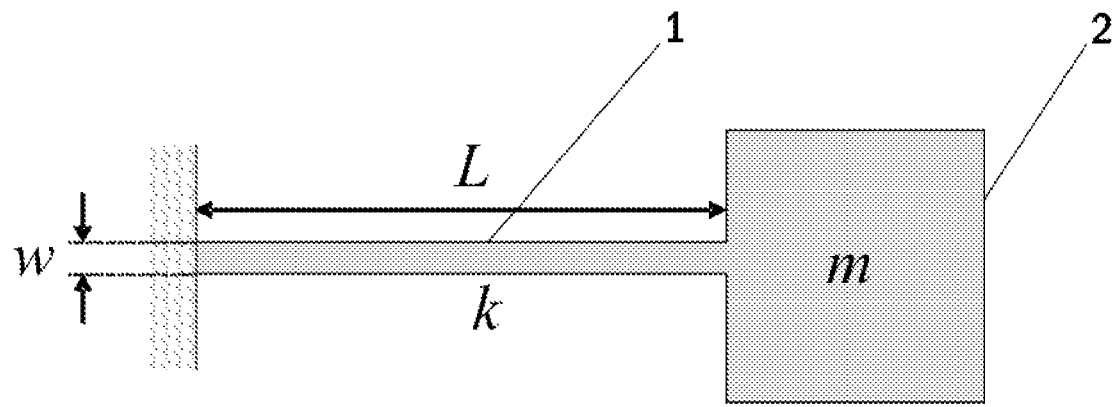
FIG. 1 illustrates a basic mechanical resonator according to prior art.
Figure 2:
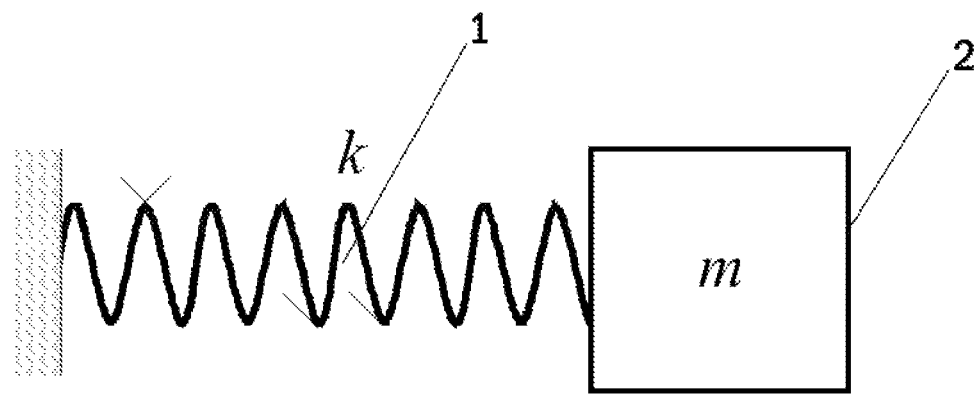
FIG. 2 illustrates a lumped model for the basic mechanical resonator according to prior art.

For example, in the case of the simple resonator of FIGS. 1 and 2, all the dimensions may change by an equal absolute amount δ due to lithography or etch variations as illustrated in FIG. 3. In the new structure of a micromechanical resonator according to the present invention the resonator is designed so that it is frequency insensitive to uniform dimensions changes.

Figure 4:
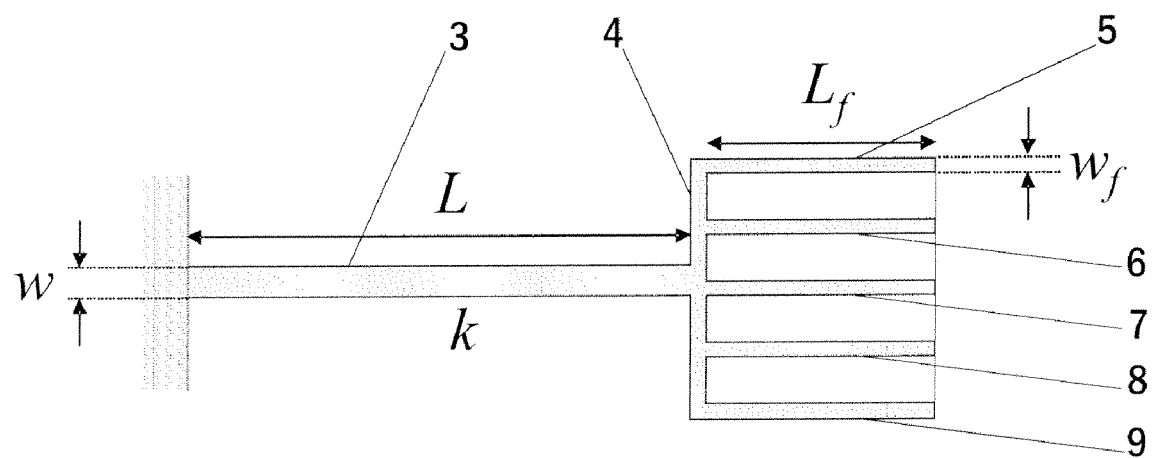
FIG. 4 illustrates a micromechanical resonator structure according to the present invention.

FIG. 4 illustrates a micromechanical resonator structure according to the present invention. The micromechanical resonator structure according to the present invention is frequency insensitive to the manufacturing variations.

The micromechanical resonator structure according to the present invention includes a spring structure 3 and a movable mass structure 4. The spring structure 3 according to the present invention includes at least one spring element 3. The movable mass structure 4 according to the present invention includes several electrode fingers 5-9 with width $w_f$. The total mass of the fingers is:

$$m = N w_f h L_f \rho, \qquad (4)$$

where N is the number of the electrode fingers 5-9, $w_f$ is the electrode finger width, h is the height, $L_f$ is the electrode finger length, and $\rho$ is the density.

The first order change of resonant frequency $\omega_0$ with respect to dimension variations is:

$$\frac{\Delta \omega_0}{\omega_0} = \frac{3}{2}\frac{\Delta w}{w} - \frac{1}{2}\frac{\Delta w_f}{w_f} = 3\frac{\delta}{w} - \frac{\delta}{w_f}. \qquad (5)$$

In this calculation of the frequency change of the micromechanical resonator structure according to the present invention we have assumed that the spring and electrode finger width change from both sides by an equal amount of dimension change $\delta$ and that lengths L and $L_f$ are long compared to the dimension change $\delta$ so that the changes due to length variations can be ignored.

We may especially choose the width of the spring elements 3 greater than the width of the electrode fingers 5-9 and specifically dimension said widths so that to the first order the sensitivity of the resonant frequency with respect to dimensional manufacturing variations approaches zero.

By choosing spring element width w so that it is 2 to 5 times, or alternatively approximately three times the electrode finger width $w_f$ ($w = 3 w_f$), in the calculation of the sensitivity of the micromechanical resonator structure according to the present invention we get $$\frac{\Delta \omega_0}{\omega_0} = 0$$

(Equation 5) and the resonant frequency is insensitive to manufacturing variations to the first order.

In the calculation of the mass of the micromechanical resonator structure according to the present invention we have used the above equation (Equation 4), which is a lumped mass approximation and does not account for the tip of the electrode fingers 5-9 moving more than the base of the spring element 3. Also, the anchoring of the electrode fingers 5-9 has been ignored in the above equation for mass (Equation 4) and accounts only for the mass of the electrode fingers 5-9.

Taking this into account the optimal value for the electrode finger width may therefore vary but it is approximately given by $w = 3 w_f$. By substituting $w \rightarrow w + 2\delta$ and $w_f \rightarrow w_f + 2\delta$ to above equations (Equations 1, 2 and 4), the sensitivity in the change of resonant frequency due to manufacturing variations can be analyzed.

Figure 5:
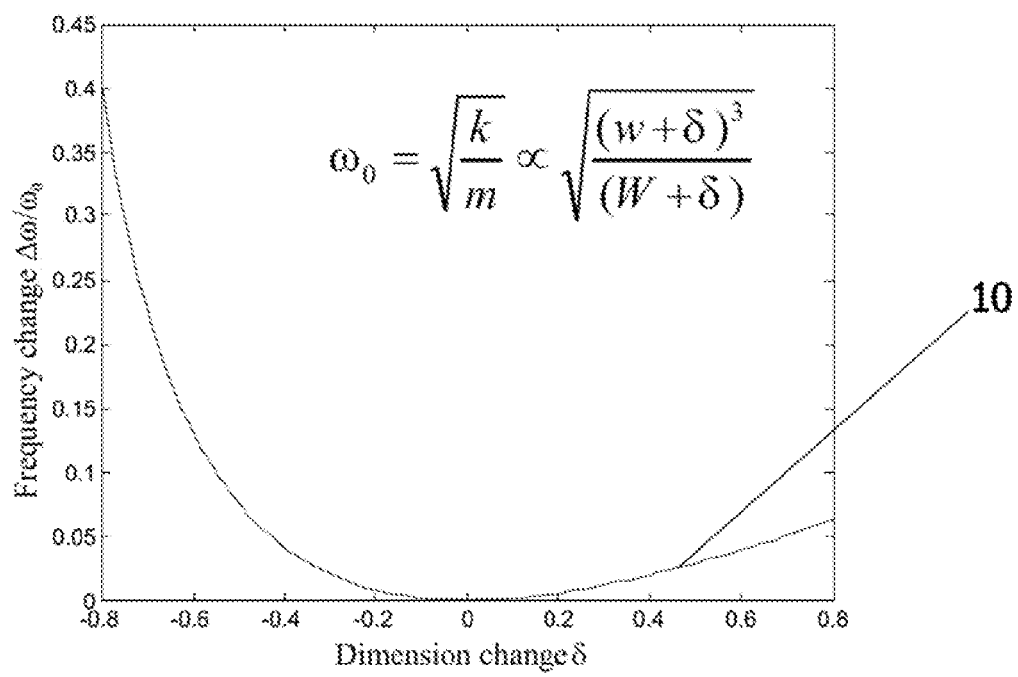
FIG. 5 illustrates the frequency change of the resonant frequency of the micromechanical resonator structure according to the present invention as function of the dimension change.

FIG. 5 illustrates the frequency change of the resonant frequency of the micromechanical resonator structure according to the present invention as function of the dimension change. The presented graph 10 shows the frequency change $$\frac{\Delta \omega_0}{\omega_0}$$

of the resonant frequency $\omega_0$ as function of the dimension change $\delta$. In the FIG. 5, w=3 is the width of the spring and W=1 is the width of the mass fingers.

From the presented graph 10 it is seen that the slope $$\frac{d(\Delta \omega_0 / \omega_0)}{d\delta}$$

is zero at $\delta = 0$ and the manufacturing variations are compensated to the first order. The slope $$\frac{d(\Delta \omega_0 / \omega_0)}{d\delta}$$

is defined as the frequency sensitivity to the manufacturing dimensional variations. By properly dimensioning the resonator, the frequency sensitivity to the manufacturing dimensional variations $$\frac{d(\Delta \omega_0 / \omega_0)}{d\delta}$$

approaches zero and the manufacturing variations are compensated to the first order.

In dimensioning said widths, one may also dimension said widths so that additional zero slope points $$\left( \frac{d(\Delta \omega_0 / \omega_0)}{d\delta} = 0 \right)$$

are generated and the sensitivity of resonant frequency with respect to dimensional manufacturing variations approaches zero.

Additional compensation is possible by noting that the electrode fingers are not entirely rigid but have a resonance frequency given by:

$$\omega_f = 0.8 \sqrt{\frac{Y}{\rho}} \frac{w_f}{L_f^2}. \qquad (6)$$

The electrode fingers typically have a resonant frequency higher than the resonant frequency for the combined resonator. However, even at frequencies lower than the electrode finger resonant frequency, the electrode fingers bend a little. Each electrode finger can be represented with a mass and a spring. In addition, the anchor point has mass.

Figure 6:
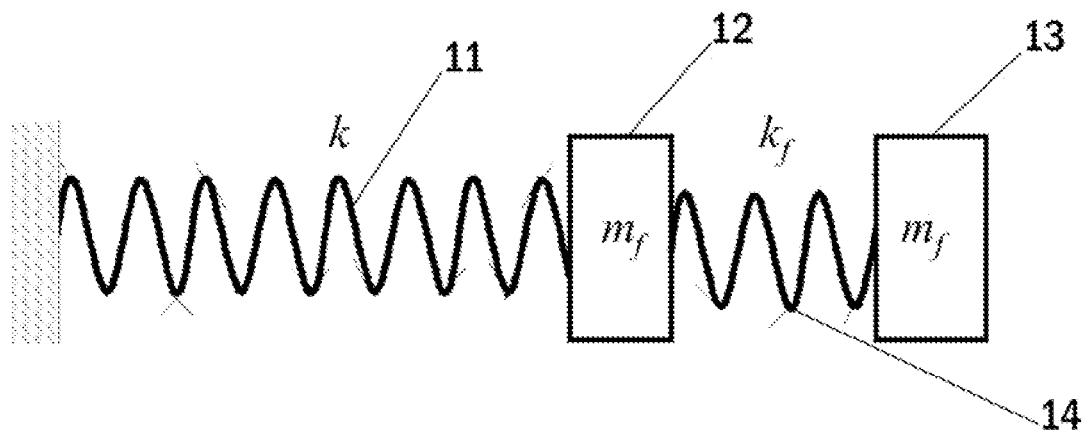
FIG. 6 illustrates a lumped model for a micromechanical resonator structure according to the present invention.

FIG. 6 illustrates a lumped model for a micromechanical resonator structure according to the present invention. The lumped model for a micromechanical resonator structure according to the present invention as presented in FIG. 5 can be used for understanding the effect of bending of the electrode fingers.

In the lumped model of FIG. 6 the spring 11 models the spring constant k of the spring element as before and the electrode fingers are modeled with two masses 12, 13 and a spring 14, where $m_f = m/2$ and mass spring constant is $k_f$. As the electrode finger is not entirely rigid, the two masses 12, 13 will have slightly different displacements. Lumped model for the resonator with parallel electrode fingers shown as one mass 13 and spring 14. For simplicity, the two masses 12, 13 are presented in FIG. 6 as equal but this is for illustration purposes only. For actual device, the lumped masses 12, 13 may not be equal depending on the dimensions.

The resonant frequency ω for the lumped model in FIG. 6 is obtained as:

$$\omega^2 = \frac{k + 2k_f - \sqrt{k^2 + 4k_f^2}}{m}. \tag{7}$$

By noting that $k/k_f \ll 1$, a series expansion of the above equation (Equation 7) can be obtained as:

$$\omega^2 \approx \omega_0^2 - \frac{1}{4}\omega_0^2 \frac{k}{k_f} = \omega_0^2 \left(1 - \frac{1}{4}\frac{k}{k_f}\right), \tag{8}$$

where $\omega_0 = \sqrt{k/m}$. As the above equation (Equation 8) shows, accounting for the electrode finger compliance lowers the resonant frequency.

Moreover, as the earlier presented equation for the spring constant k (Equation 2) shows, the spring constants are proportional to the cube of spring element widths. Therefore, the above equation (Equation 8) can be written as:

$$\omega^2 \approx \omega_0^2 \left(1 - \frac{1}{4}\frac{L_f^3}{L^3}\frac{w^3}{w_f^3}\right) = \omega_0^2 \left(1 - a\frac{w^3}{w_f^3}\right), \tag{9}$$

where w is the width of the spring element, $w_f$ is the width of the electrode finger and a is a parameter depending on the spring element and electrode finger lengths.

As $w_f < w$, the above equation (Equation 9) shows that due to distributed compliance of the electrode fingers, reducing the electrode finger width and spring element width by an equal amount will change the value of the correction term $$\left(1 - a\frac{w^3}{w_f^3}\right)$$

in the above equation (Equation 9). This gives an additional degree of freedom to reduce the frequency sensitivity to manufacturing variations.

Figure 7:
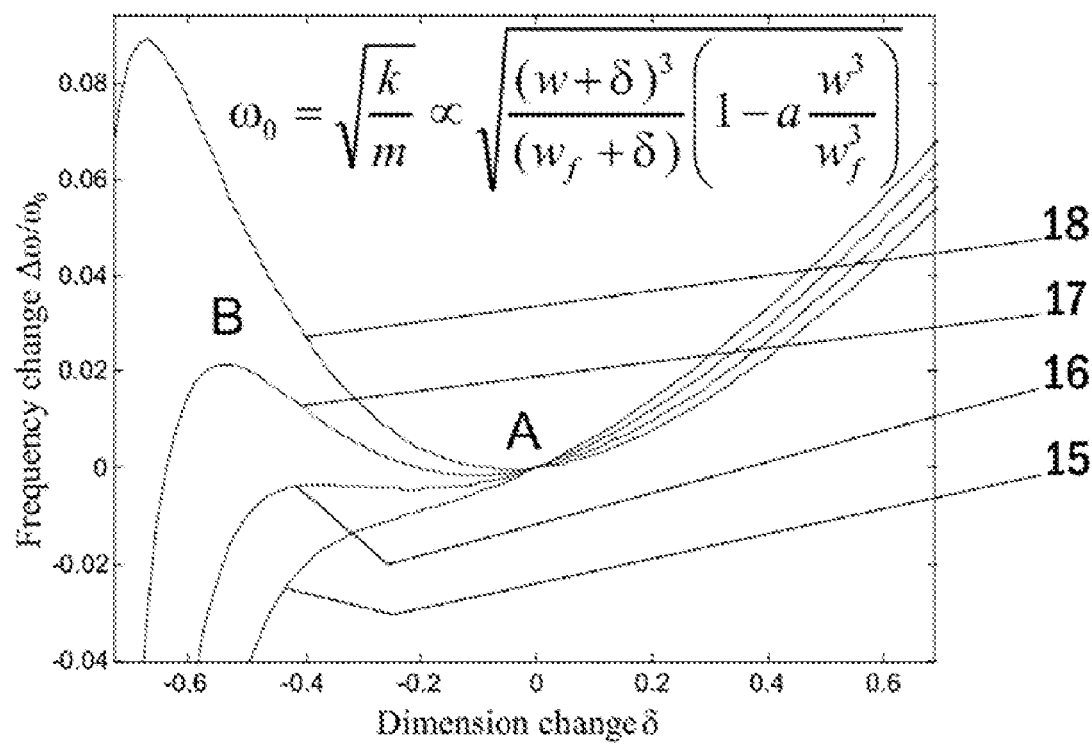
FIG. 7 illustrates the frequency change of the resonant frequency of the micromechanical resonator structure having spring element width three times the electrode finger width and elastic electrode fingers according to the present invention as function of the dimension change.

FIG. 7 illustrates the frequency change of the resonant frequency of the micromechanical resonator structure having spring element width three times the electrode finger width ($w = 3w_f$) and elastic electrode fingers according to the present invention as function of the dimension change.

The presented graphs 15-18 show the frequency change $$\frac{\Delta\omega_0}{\omega_0}$$

of the resonant frequency $\omega_0$ as function of the dimension change δ.

From the presented graphs 15-18 it is seen that in addition to the resonant frequency change $$\frac{\Delta\omega_0}{\omega_0}$$

having the local minima A at δ=0, there also is local maxima B, which are also observed for small values of the parameter a. Thus, there are two points where the slope $$\frac{d(\Delta\omega_0/\omega_0)}{d\delta}$$

is zero and the manufacturing variations are compensated to the second order. Increasing the value of the parameter a will lower the local maximum and with a sufficiently large value for the parameter a no local dependency frequency change on dimension change will become monotonic. This gives an additional degree of freedom to reduce the frequency sensitivity to manufacturing variations as illustrated in FIG. 7.

The proper dimensioning of the spring element and electrode finger widths is used to compensate for the manufacturing variation to the first order leading to local minima in resonant frequency (point A). By choosing the electrode finger length so that electrode finger resonant frequency affects the resonator resonant frequency, a localized maximum can be generated (point B). These two degrees of freedom (dimensioning of the widths and lengths) can be used to design a resonator that is insensitive to manufacturing variations over large dimensional change δ as illustrated in FIG. 7.

Figure 8:
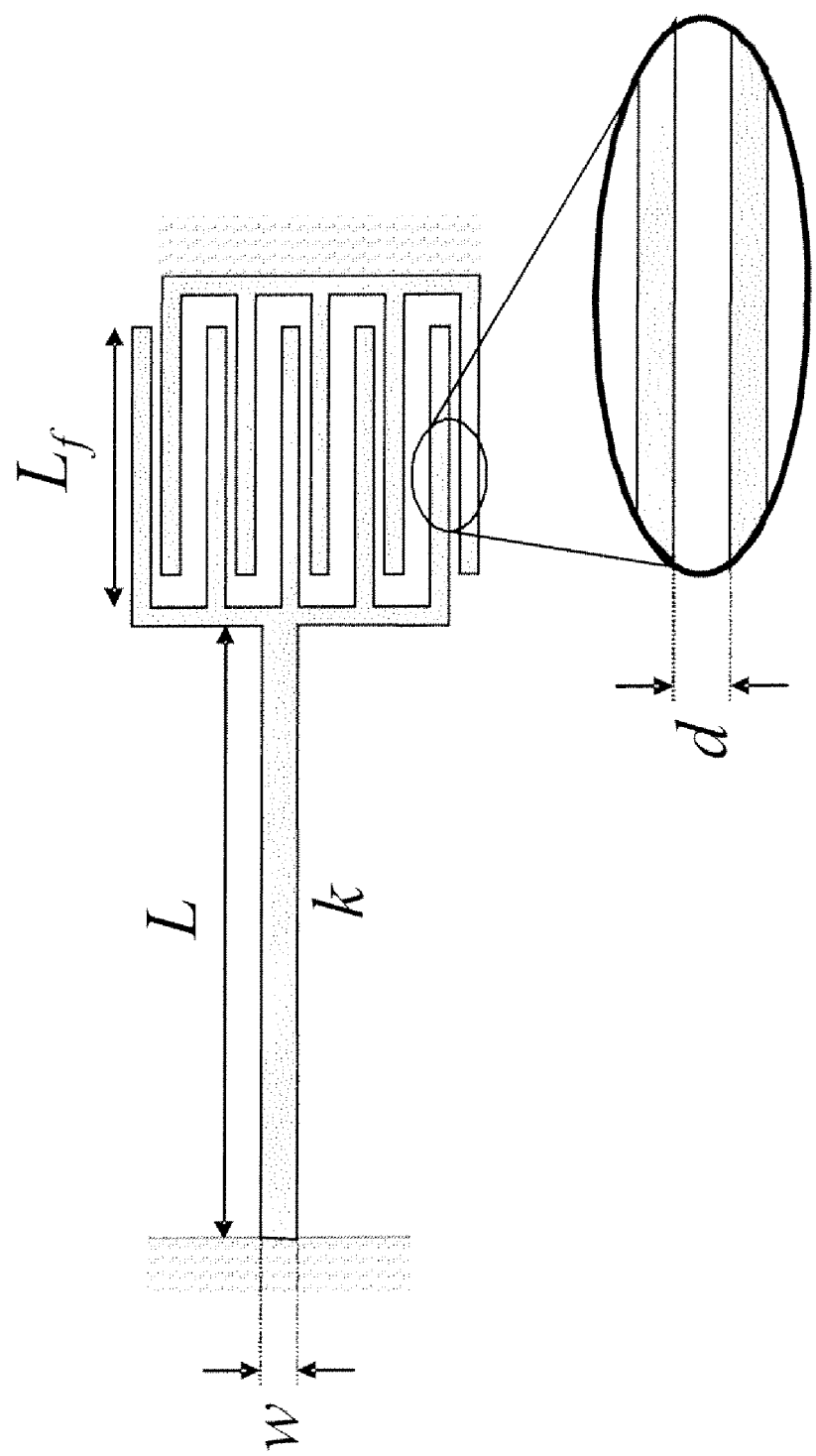
FIG. 8 illustrates an electrostatic excitation of a micromechanical resonator structure according to the present invention.

FIG. 8 illustrates an electrostatic excitation of a micromechanical resonator structure according to the present invention. The multiple electrode fingers of the micromechanical resonator structure according to the present invention can be used for electrostatic excitation of the resonator. A fixed counter electrode is a distance d from the moving resonator electrode. The resonator electrode and fixed electrode form a capacitor. When a voltage V is applied over the resonator and fixed electrode, a force $$F = \frac{1}{2}\frac{\partial C(x)}{\partial x}V^2, \tag{10}$$

will affect the resonator. As the capacitance C is proportional to the total area, a large number of electrode fingers can be used for effective actuation of the resonator.

Furthermore, the electrostatic force given by the above equation (Equation 10) can be used to tune the resonant frequency. This can be used to electronically calibrate out any remaining manufacturing variations and temperature frequency dependency of the resonator.

The effective spring force from (10) is:

$$k_e = -\frac{b}{d^3}V^2, \tag{11}$$

where b is a constant that depends on the electrode area, the electrode position, and the permittivity, d is the electrode gap, and V is the bias voltage. Due to manufacturing variations, the actual electrode gap is $$d = d_0 - \delta, \tag{12}$$

where $d_0$ is the ideal electrode spacing and δ is the dimension change of the electrode. If the size of the electrode increases, the gap between the electrodes decreases. As noted from the two previous equations:

$$k_e = -\frac{b}{(d_0 - \delta)^3} V^2, \quad (13)$$

the electrical spring can further compensate the manufacturing variations. The resonant frequency modified by the electrical spring force is given by $$\omega_0 = \sqrt{\frac{k + k_e}{m}} = \sqrt{\frac{k}{m}\left(1 + \frac{k_e}{k}\right)} \Rightarrow$$

$$\omega_0 = \omega_0 \sqrt{\left(1 + \frac{k_e}{k}\right)} \propto \sqrt{\frac{(w + \delta)^3}{(w_f + \delta)}\left(1 - c\frac{(w_f + \delta)^3}{(d_0 - \delta)^3}\right)}, \quad (14)$$

where c is dimension dependent constant.

Figure 9:
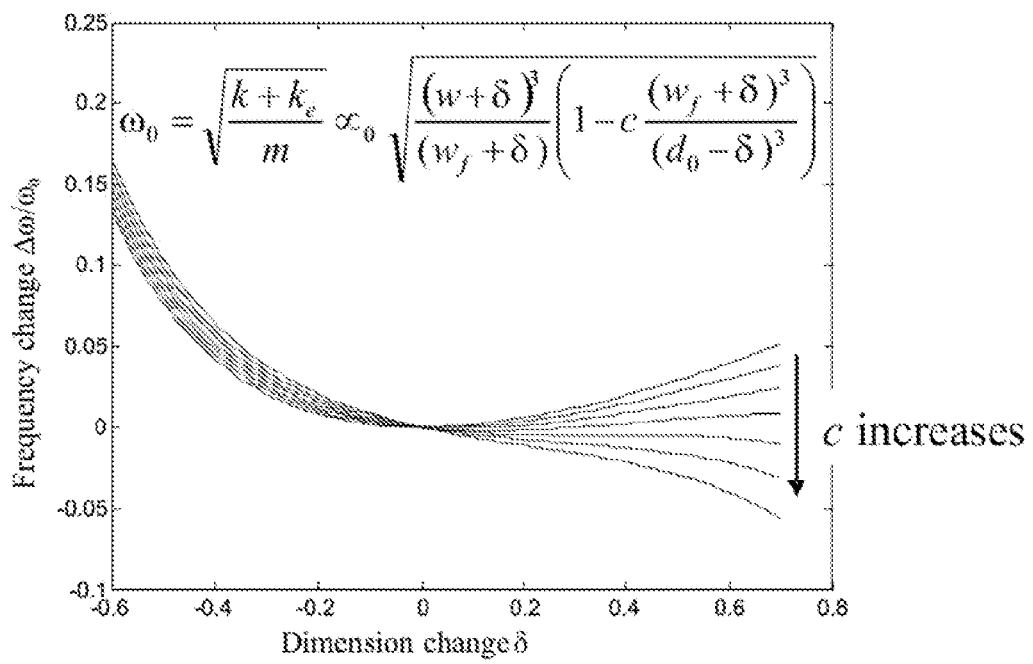
FIG. 9 illustrates the relative frequency change of the resonant frequency of the micromechanical resonator structure having spring element width three times the electrode finger width and including the electrical spring effect according to the present invention as function of the dimension change.

FIG. 9 illustrates the relative frequency change of the resonant frequency of the micromechanical resonator structure having spring element width three times the electrode finger width and including the electrical spring effect according to the present invention as function of the dimension change.

The graph in FIG. 9 shows the relative frequency change $$\frac{\Delta\omega_0}{\omega_0}$$

of the resonant frequency $\omega_0$ as function of the dimension change $\delta$. For positive values of dimension change, the electrical spring will reduce frequency change.

From the graph it is seen how the electrical spring effect can be used to further minimize the frequency change due to dimension change. If further reduction in variation is needed, the final trimming of the device can be accomplished by adjusting the bias voltage V to adjust the electrical spring or by physical trimming such as laser trimming.

The solution according to the present invention presents a new structure of a micromechanical resonator which has an improved frequency accuracy in comparison to the prior art solutions. The optimal device dimensions are obtained by combining the demonstrated effects.

In the solution according to the present invention the spring element width w and the electrode finger width $w_f$ are chosen so that spring element width w is approximately three times the electrode finger width $w_f$ (w=3$w_f$). The relationship is not exact as the electrode finger support has not been considered and the other two compensation methods can be used to tailor dependency of the device resonant frequency on dimension changes. The optimal range for the spring element width can vary from the spring element width w being approximately two to five times the electrode finger width $w_f$ (w=2$w_f$ to w=5$w_f$).

In the solution according to the present invention the electrode finger length $L_f$ is chosen to be sufficiently long so that the distributed elasticity of the electrode finger affects the resonant frequency. The optimal range for the electrode finger length may vary from $L_f$=L/6 to $L_f$=L/2.

In the solution according to the present invention the electrode gap d is chosen to be sufficiently small to affect the resonant frequency. The optimum gap ranges from 500 nm to 5 μm.

Figure 10:
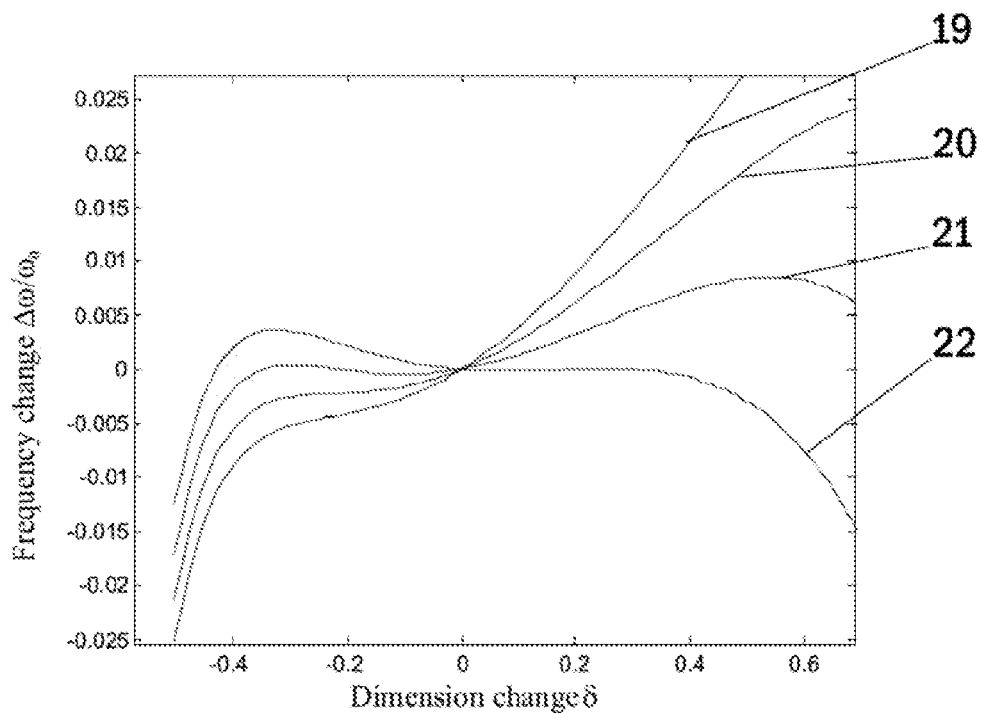
FIG. 10 illustrates the frequency change of the resonant frequency of the micromechanical resonator structure having spring element width three times the electrode finger width, having elastic electrode fingers, and including the electrical spring effect according to the present invention as function of the dimension change.

FIG. 10 illustrates the frequency change of the resonant frequency of the micromechanical resonator structure having spring element width three times the electrode finger width, having elastic electrode fingers, and including the electrical spring effect according to the present invention as function of the dimension change.

The presented graphs 19-22 show the change in the resonant frequency $$\frac{\Delta\omega_0}{\omega_0}$$

of the resonant frequency $\omega_0$ as function of the dimension change $\delta$. The presented graphs 19-22 show the effect of combining all the previously mentioned three approaches and shows how the sensitivity to dimensional change can be minimized for a wide range of variations. Combination of the three mentioned compensation methods is used to obtain minimal frequency change. In the curves, the resonator dimensions are changed and the gap is varied.

Figure 11:
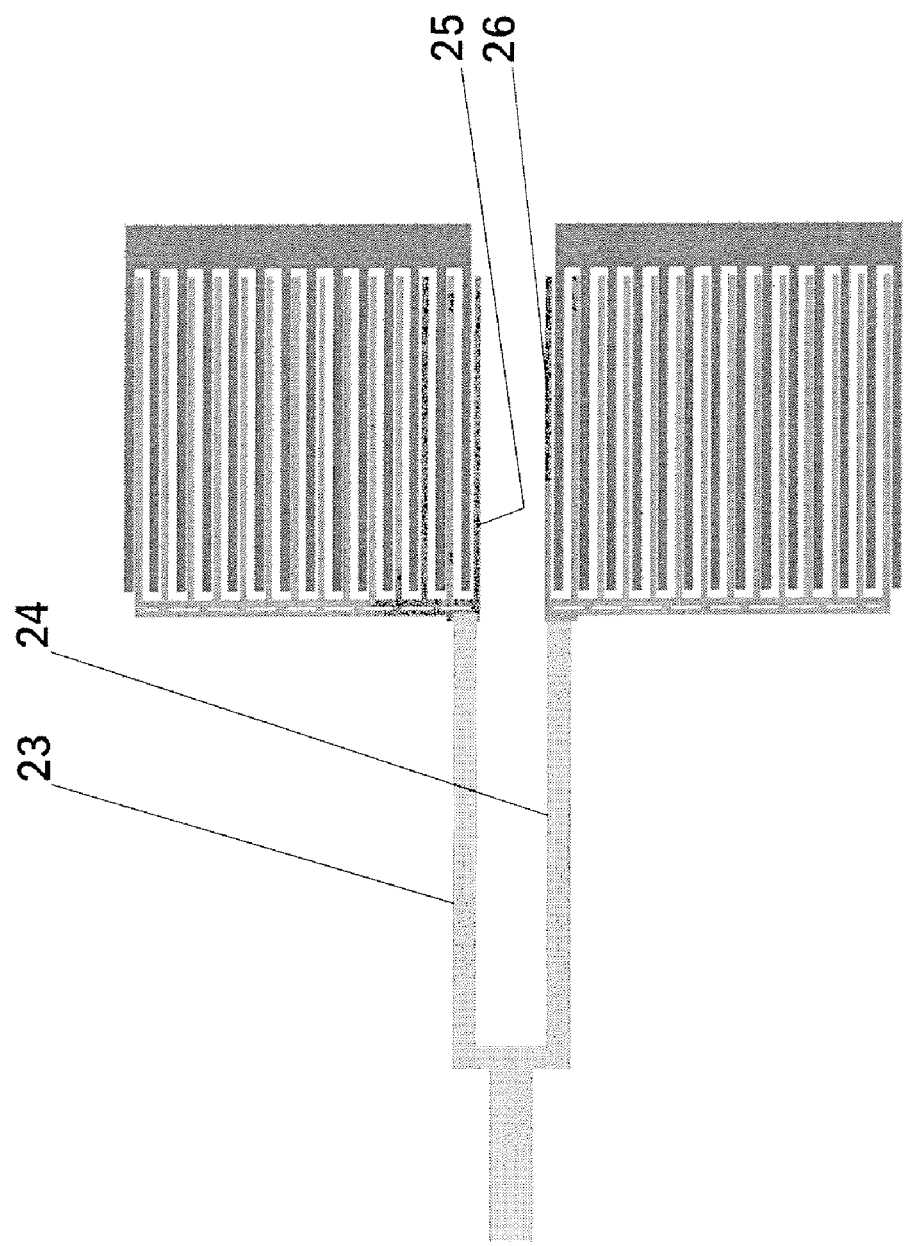
FIG. 11 illustrates a micromechanical resonator structure having spring element width three times the electrode finger width, having elastic electrode fingers, and including the electrical spring effect according to the present invention as function of the dimension change.

FIG. 11 illustrates a micromechanical resonator structure having spring element width three times the electrode finger width, having elastic electrode fingers, and including the electrical spring effect according to the present invention as function of the dimension change.

The resonator is made of single crystal silicon and has two spring elements 23, 24 anchored at the same location. This tuning fork structure minimizes the spring element anchor movement thus minimizing the anchor losses. Both spring elements 23, 24 have a mass made of multiple electrode fingers 25, 26. The resonator has two spring elements anchored at the same location the mass is formed by multiple electrode fingers 25, 26. The vibration mode minimizes the anchor losses as the motion of the two spring elements 23, 24 cancel. The resonator target resonance frequency is 32,768 Hz and the dimensions are given in Table 1 below.

TABLE 1

| Parameter | Dimension [μm] |
| --- | --- |
| Spring element length | 265 |
| Spring element width | 12.6 |
| Electrode finger length | 200 |
| Electrode finger width | 3 |
| No. of electrode fingers | 14 |
| Electrode gap | 3 |

Figure 12:
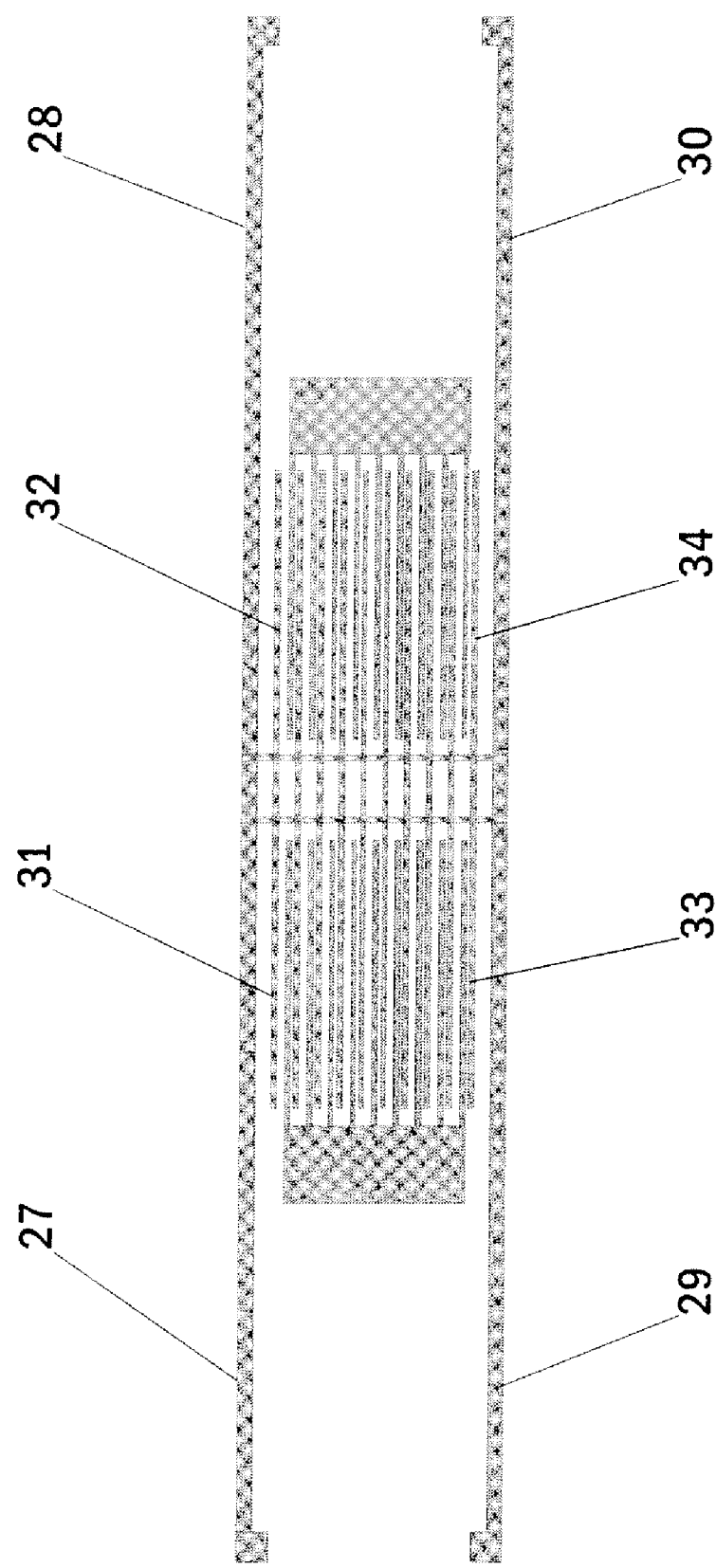
FIG. 12 illustrates another embodiment of a micromechanical resonator structure having spring element width three times the electrode finger width, having elastic electrode fingers, and including the electrical spring effect according to the present invention as function of the dimension change.

FIG. 12 illustrates another embodiment of a micromechanical resonator structure having spring element width three times the electrode finger width, having elastic electrode fingers, and including the electrical spring effect according to the present invention as function of the dimension change.

In FIG. 12 the mass is made of multiple electrode fingers 31-34 and the spring element width w is approximately three times the electrode finger width $w_f$ ($w_f$=w/3). The device is anchored with multiple spring elements 27-30 i.e. guided beams 27-30 to restrain the mass movement in one direction only. As the spring elements 27-30 cannot rotate freely, the guided beam spring elements 27-30 are four times stiffer than the simple cantilever springs with equal length. Conversely, to obtain the same spring constant, the guided beams 27-30 should be longer than a simple spring. In FIG. 12 the guided beam spring elements 27-30 are thicker than the electrode fingers 31-34 to compensate for the dimensional changes. Also, the resonant frequency of electrode fingers 31-34 is slightly higher than the resonant frequency for the whole resonator.

The micromechanical resonator structure according to the present invention is insensitive to systematic manufacturing variations.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

The invention claimed is:

1. A micromechanical resonator comprising:
   a movable mass structure; and
   a spring structure, comprising a spring element, the spring element anchored from one end and connected to a plurality of electrode fingers on another end, wherein the plurality of electrode fingers are operatively connected together only at the other end of the spring element, wherein the plurality of electrode fingers extend parallel to the spring element.

2. The micromechanical resonator according to claim 1, wherein the spring structure comprises two spring elements that are anchored together to form a tuning fork structure.

3. The micromechanical resonator according to claim 2, wherein the finger electrodes connected to one of the two spring elements in the tuning fork structure are symmetrically arranged to those connected to the other of the two spring elements in the tuning fork structure.

4. The micromechanical resonator of claim 1, wherein a width of the spring element is greater than the widths of the electrode fingers, the widths of the electrode fingers are dimensioned so that a sensitivity of a resonant frequency change with respect to dimensional manufacturing variations $d(\Delta\omega_0/\omega_0)/d\delta$ approaches zero, wherein $\Delta\omega_0/\omega_0$ is a frequency change of a resonant frequency $\omega_0$ and $\delta$ is a dimension change.

5. The micromechanical resonator according to claim 1, wherein a width of the spring element is two to five times the widths of the electrode fingers.

6. The micromechanical resonator according to claim 1, wherein a width of the spring element is approximately three times the widths of the electrode fingers.

7. The micromechanical resonator according to claim 1, further comprising:
   means for actuating the resonator electrostatically.

8. The micromechanical resonator according to claim 1, wherein the micromechanical resonator has a width of an electrode gap from 500 nm to 5 µm.

9. The micromechanical resonator according to claim 1, wherein the micromechanical resonator comprises a plurality of inter-digital electrodes for each of the pluralities of the finger electrodes.

10. A micromechanical resonator comprising:
    a movable mass structure; and
    a spring structure, comprising a spring element, the spring element anchored from one end and connected to a plurality of electrode fingers on another end, wherein the plurality of electrode fingers are operatively connected together at the other end of the spring element, wherein resonant frequencies of the electrode fingers are two to five times higher than a resonant frequency of the micromechanical resonator.

11. A micromechanical resonator comprising:
    a movable mass structure; and
    a spring structure, comprising a spring element, the spring element anchored from one end and connected to a plurality of electrode fingers on another end, wherein the plurality of electrode fingers are operatively connected together at the other end of the spring element, wherein widths of the electrode fingers are dimensioned so that a slope of a resonant frequency change with respect to dimensional manufacturing variation change approaches zero at two or more locations.

12. A micromechanical resonator comprising:
    a movable mass structure; and
    a spring structure, comprising a spring element, the spring element anchored from one end and connected to a plurality of electrode fingers on another end, wherein the plurality of electrode fingers are operatively connected together at the other end of the spring element, wherein widths of the electrode fingers are configured so that a resonance frequency $$\omega_f = 0.8 \sqrt{\frac{Y}{\rho}} \frac{w_f}{L_f^2}$$

of each of the electrode fingers is taken into account, wherein $w_f$ is an electrode finger width, $L_f$ is an electrode finger length, $\rho$ is a density, and $Y$ is Young's modulus.

13. A micromechanical resonator comprising:
    a movable mass structure; and
    a spring structure, comprising a spring element, the spring element anchored from one end and connected to a plurality of electrode fingers on another end, wherein the plurality of electrode fingers are operatively connected together at the other end of the spring element, wherein in dimensioning widths of the electrode fingers, an effect of bending of the electrode fingers is taken into account.

14. A micromechanical resonator comprising:
    a movable mass structure; and
    a spring structure, comprising a spring element, the spring element anchored from one end and connected to a plurality of electrode fingers on another end, wherein the plurality of electrode fingers are operatively connected together at the other end of the spring element, wherein lengths of the electrode fingers are dimensioned so that electrode finger resonant frequency affects a resonant frequency of the micromechanical resonator to generate a localized maximum of a micromechanical resonator resonant frequency change with respect to dimensional manufacturing variation change.

15. The micromechanical resonator according to claim 14, wherein lengths of the electrode fingers are 1/6 to 1/2 times a length of the spring element.

* * * * *